United States Patent
Kim et al.

(10) Patent No.: US 8,756,483 B2
(45) Date of Patent: Jun. 17, 2014

(54) RECEIVER FOR REDUCING POWER CONSUMPTION AND DIGITAL BROADCAST RECEIVING SYSTEM INCLUDING THE SAME

(75) Inventors: Dong Wan Kim, Seoul (KR); Sergey Zhidkov, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 657 days.

(21) Appl. No.: 12/544,458

(22) Filed: Aug. 20, 2009

(65) Prior Publication Data

US 2010/0050056 A1  Feb. 25, 2010

(30) Foreign Application Priority Data

Aug. 25, 2008  (KR) .................. 10-2008-0082715

(51) Int. Cl.
   *G06F 11/00*  (2006.01)
(52) U.S. Cl.
   USPC .......................................................... 714/776
(58) Field of Classification Search
   USPC .......................................................... 714/776
   See application file for complete search history.

(56) References Cited

U.S. PATENT DOCUMENTS

| | | | | |
|---|---|---|---|---|
| 2006/0077300 | A1* | 4/2006 | Cheon et al. | 348/614 |
| 2007/0186143 | A1* | 8/2007 | Gubbi et al. | 714/776 |
| 2008/0092203 | A1* | 4/2008 | Bouazizi et al. | 725/135 |
| 2008/0301477 | A1* | 12/2008 | Gade et al. | 713/320 |
| 2010/0281510 | A1* | 11/2010 | Bichot et al. | 725/114 |

FOREIGN PATENT DOCUMENTS

| | | |
|---|---|---|
| KR | 1020050033306 | 4/2005 |
| KR | 1020050067928 | 7/2005 |
| KR | 1020060099724 | 9/2006 |
| WO | WO 99/48221 | 9/1999 |

OTHER PUBLICATIONS

WO 2007/031114 A1, Gade et. al.*

* cited by examiner

*Primary Examiner* — Yair Leibovich
(74) *Attorney, Agent, or Firm* — F. Chau & Associates, LLC

(57) ABSTRACT

A receiver includes a frame boundary detector and a link controller. The frame boundary detector receives a plurality of transport stream (TS) packets and generates a control signal based on boundary information of the TS packets. The link controller disables a part of the receiver to disable forwarding of subsequent TS packets in response to the control signal. Each of the TS packets is a multi protocol encapsulation (MPE) section or a multi protocol encapsulation-forward error correction (MPE-FEC) section.

15 Claims, 6 Drawing Sheets

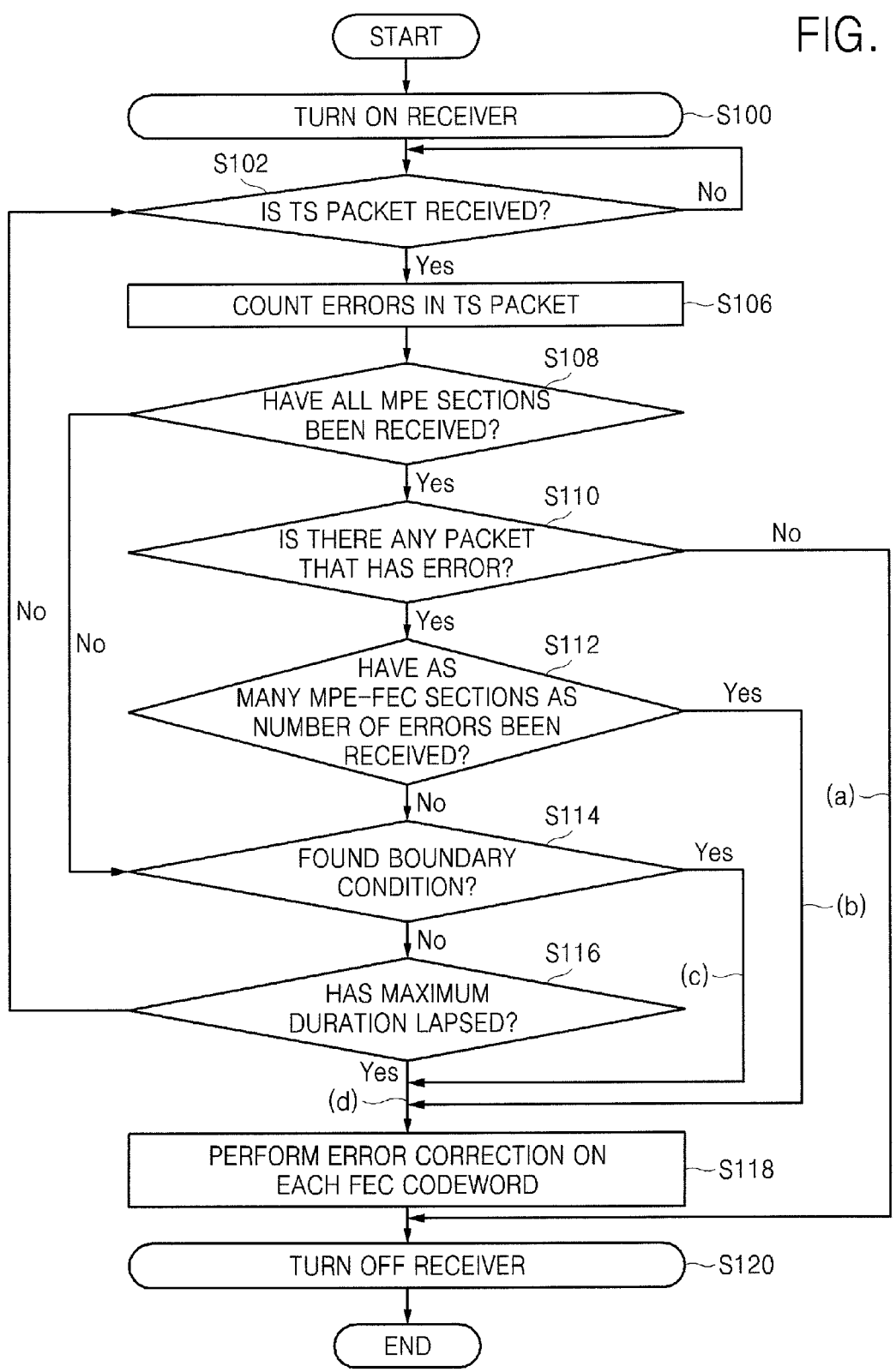

RECEIVER FOR REDUCING POWER CONSUMPTION AND DIGITAL BROADCAST RECEIVING SYSTEM INCLUDING THE SAME

CROSS-REFERENCE TO RELATED PATENT APPLICATION

This application claims priority to Korean Patent Application No. 10-2008-0082715, filed on Aug. 25, 2008, in the Korean Intellectual Property Office, the disclosure of which is incorporated by reference in its entirety herein.

BACKGROUND

1. Technical Field

Embodiments of the present invention relate to a receiver, and more particularly, to a receiver for reducing power consumption and a digital broadcasting receive system including the same.

2. Discussion of Related Art

Digital video broadcasting (DVB) is a set of international standards for defining digital broadcasting of video, audio, and data. DVB systems distribute data using a variety of approaches, including by satellite (DVB-S), cable (DVB-C), terrestrial television (DVB-T), and digital terrestrial television for handhelds (DVB-H). In particular, The DVB-H format may be used in a mobile environment by portable devices to receive Internet Protocol (IP) data that includes television programs.

Mobile service for mobile broadcasting has restrictions according to limited battery capacity since the service is received using portable devices such as mobile phones, portable media players (PMPs), and personal digital assistants (PDAs).

The power consumed by a receiver using DVB-H can be reduced using time slicing. In time slicing, large segments of data are sent in bursts, allowing the receiver to be switched off in inactive periods. However, it can be difficult to turn the power of the receiver on or off with exact timing.

Accordingly, there is need for a receiver whose power modes can be controlled more precisely for reducing power consumption.

SUMMARY

An exemplary embodiment of the present invention includes a receiver having a frame boundary detector and a link controller. The frame boundary detector receives a plurality of TS packets and generates a control signal based on boundary information in the TS packets. The link controller deactivates a part of the receiver to disable forwarding of subsequent TS packets in response to the control signal. Each of the TS packets is a multi protocol encapsulation (MPE) section or a multi protocol encapsulation-forward error correction (MPE-FEC) section.

The frame boundary detector may include an error detector and a packet controller. The error detector determines whether each of the TS packets has an error based on header information of each TS packet and generates first error information regarding MPE sections and second error information regarding MPE-FEC sections. The packet controller analyzes each of the TS packets output from the error detector and generates the control signal based on a result of the analysis.

The frame boundary detector may further include a frame map configured to receive and store the first error information and the second error information generated by the error detector and an error code generator configured to generate an error generation code based on the first error information and the second error information. The packet controller may be configured to analyze each of the TS packets output from the error detector, receive the error generation code according to a result of the analysis, receive as many MPE-FEC sections as the number of errors corresponding to the error generation code, and then generate the control signal.

The packet controller may receive the error generation code based on a table boundary value when the analysis result shows that at least one of the TS packets includes the table boundary value, and the packet controller may receive the error generation code when at least one MPE-FEC section is received when the analysis result shows that each of the TS packets does not include the table boundary value.

The link controller may enable or disable at least one among the error detector, the packet controller, the frame map, and the error code generator in response to the control signal. The receiver may use time slicing.

An exemplary embodiment of the present invention includes a digital broadcast receiving system having a radio frequency (RF) circuit configured to convert an RF signal into a digital signal, a physical layer configured to convert the digital signal into a plurality of TS packets, a frame boundary detector configured to receive the TS packets and generate a control signal based on boundary information in the TS packets, and a link controller configured to generate a power control signal for controlling power of at least one among the RF circuit, the physical layer, and the frame boundary detector in response to the control signal. Each of the TS packets may be an MPE section or an MPE-FEC section.

The frame boundary detector may include an error detector configured to determine whether each of the TS packets has an error based on header information of each TS packet and generate first error information regarding MPE sections and second error information regarding MPE-FEC sections and a packet controller configured to analyze each of the TS packets output from the error detector and generate the control signal based on a result of the analysis.

The frame boundary detector may further include a frame map configured to receive and store the first error information and the second error information generated by the error detector and an error code generator configured to generate an error generation code based on the first error information and the second error information. The packet controller analyzes each of the TS packets output from the error detector, receives the error generation code according to a result of the analysis, receives as many MPE-FEC sections as the number of errors corresponding to the error generation code, and then generates the control signal.

An exemplary embodiment of the present invention includes a receiver having an error detector, a packet controller, and a link controller. The error detector is configured to receive a plurality of transport stream (TS) packets including at least one MPE section and at least one MPE-FEC section. The error detector is further configured to examine a header of each section to determine a count of the number of errors associated with the sections. The packet controller is configured to receive the TS packets from the error detector, determine a boundary time point between a last one of the least one MPE section and a first one of the least one MPE-FEC section, request the count from the error detector at the boundary point time, and output a control signal when as many of the MPE-FEC sections that correspond to the count are received. The link controller is configured to deactivate a part of the receiver in response to the control signal to disable forwarding of subsequent TS packets.

The error detector may further include a frame map to store error information associated with the header of each of the sections. The error code generator may be configured to access the error information of the frame map to generate the count. The error code generator may be enabled in response to the request from the packet controller. The error detector may be configured to examine the header of each section to determine the count by examining contents of a transport error indicator field of the header. The packet controller may be configured to determine the boundary time point when one of: a table boundary field of the header of one of the sections is set, or when none of the table boundary fields is set and a first one of the MPEC-FEC sections has been received. The link controller may be configured to disable at least one of the error detector, the packet controller, the frame map, and the error code generator in response to the control signal.

An exemplary embodiment of the present invention includes a method of operating a receiver. The method includes determining a count of errors in a plurality of transport stream (TS) packets input to the receiver, determining a boundary time using information in headers of the sections, estimating a frame end time when as many of the MPE-FEC sections have been received after the boundary time that correspond to the count, and disabling a part of the receiver responsible for forwarding subsequent TS packets at the estimated frame end time. The TS packets include at least one MPE section and at least one MPE-FEC section. The method is performed using a frame boundary detector of the receiver.

The determining of the boundary time may include determining whether a table boundary field or a frame boundary field in the headers of at least one of the sections is set to establish a first condition, determining whether a first one of the at least one MPE-FEC sections has been received when it is determined that none of the boundary fields is set to establish a second condition, and setting the boundary time when the first condition or the second condition has been established. The determining of the count of errors may include examining a state of a transport error indicator field of the header of each section. The estimating of the frame end time may include adding the boundary time to a time that elapses after the count of MPE-FEC sections has been received. The disabling of the part of the receiver may include disabling at least of a radio frequency (RF) circuit, a physical layer, or the frame boundary detector of the receiver. The method may include enabling the disabled part after a subsequent burst of the TS packets has been received.

BRIEF DESCRIPTION OF THE DRAWINGS

The present invention will become more apparent by describing in detail exemplary embodiments thereof with reference to the attached drawings in which:

FIG. 6 is a flowchart of a method of processing a data error in a digital broadcast receiving system according to an exemplary embodiment of the present invention.

DETAILED DESCRIPTION OF EXEMPLARY EMBODIMENTS

Figure 1:
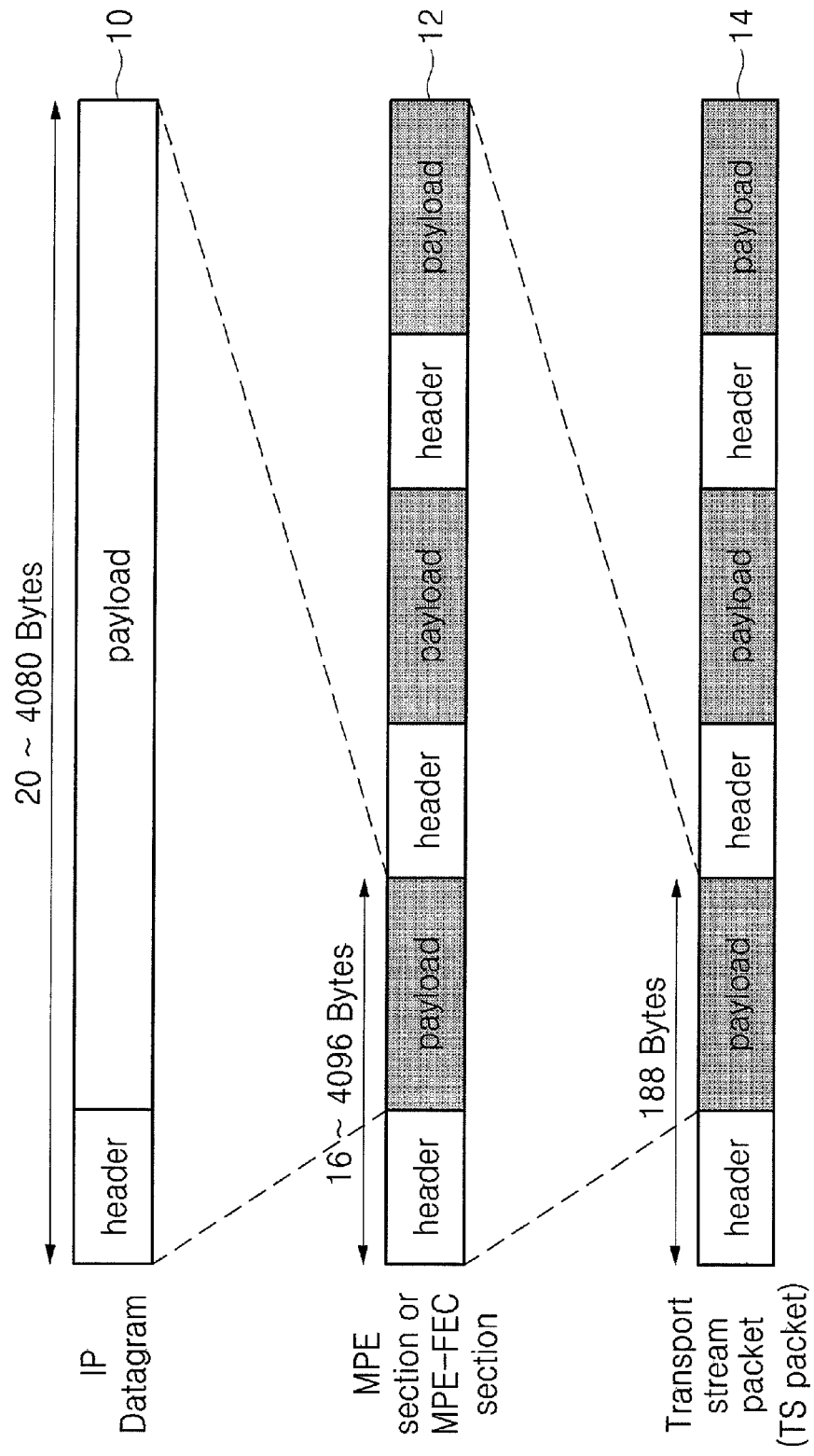
FIG. 1 is a block diagram of a transport stream (TS) packet in a typical digital broadcast receiving system.

The present invention now will be described more fully hereinafter with reference to the accompanying drawings, in which embodiments of the invention are shown. This invention may, however, be embodied in many different forms and should not be construed as limited to the embodiments set forth herein. In the drawings, like numbers refer to like elements throughout.

It will be understood that when an element is referred to as being "connected" or "coupled" to another element, it can be directly connected or coupled to the other element or intervening elements may be present.

FIG. 1 is a block diagram of a transport stream (TS) packet in a conventional digital broadcast receiving system. The digital broadcast receiving system may be a personal terminal such as a cellular phone, a portable multimedia player (PMP), a personal digital assistant (PDA), or a navigator device, which uses a digital video broadcasting-handheld (DVB-H) communication protocol.

Broadcast data may be generated in a form of an Internet protocol (IP) datagram. The IP datagram includes a header and a payload including broadcast data. The header may include address information indicating the destination of the broadcast data and identification (ID) information for uniquely identifying the broadcast data. For example, the IP datagram may be 20 bytes or a maximum of 4080 bytes in length. The IP datagram may be encoded using Reed-Solomon (R-S) coding, forming a multi protocol encapsulation-forward error correction (MPE-FEC) frame. The MPE-FEC frame includes an MPE section including the IP datagram and/or an MPE-FEC section including parity data resulting from the R-S coding.

The MPE section or the MPE-FEC section includes a header and a payload. The header includes information indicating whether data included in the payload is the MPE section or the MPE-FEC section. The header also includes delta-T information, a table boundary value, and a frame boundary value. The delta-T information indicates a time when a subsequent MPE-FEC frame is transmitted (e.g., a time difference between a current burst and a next burst). The frame boundary value indicates whether the MPE section is the last one in an application data table (e.g., see 11 in FIG. 2) with respect to the MPE-FEC frame or whether the MPE-FEC section is the last one of an R-S data table (e.g., see 12 in FIG. 2) with respect to the MPE-FEC frame. The frame boundary value also indicates whether the MPE or MPE-FEC section is the last section in the MPE-FEC frame. The table boundary value is set to "1" only at the last MPE section of the application data table 11 or the last MPE-FEC section of the R-S data table 12 with respect to the MPE-FEC frame. The frame boundary value is set to "1" only at the last section of an entire table including the application data table 11 and the R-S data table 12 with respect to the MPE-FEC frame. A single MPE or MPE-FEC section may be 16 bytes or a maximum of 4096 bytes in length.

The TS packet includes a header and a payload. The payload includes the MPE section and/or the MPE-FEC section. A single TS packet may include a plurality of MPE sections or a plurality of MPE-FEC sections. Alternatively a single MPE section or a single MPE-FEC section may be transmitted using a plurality of TS packets. A single TS packet may include a 4-byte header and a 184-byte payload in a total length of 188 bytes. A TS packet transmitted from a physical layer is stored in a TS buffer (e.g., see 23 in FIG. 4) and the stored TS packet is read by a link layer (e.g., see 20 in FIG. 3).

Figure 2:
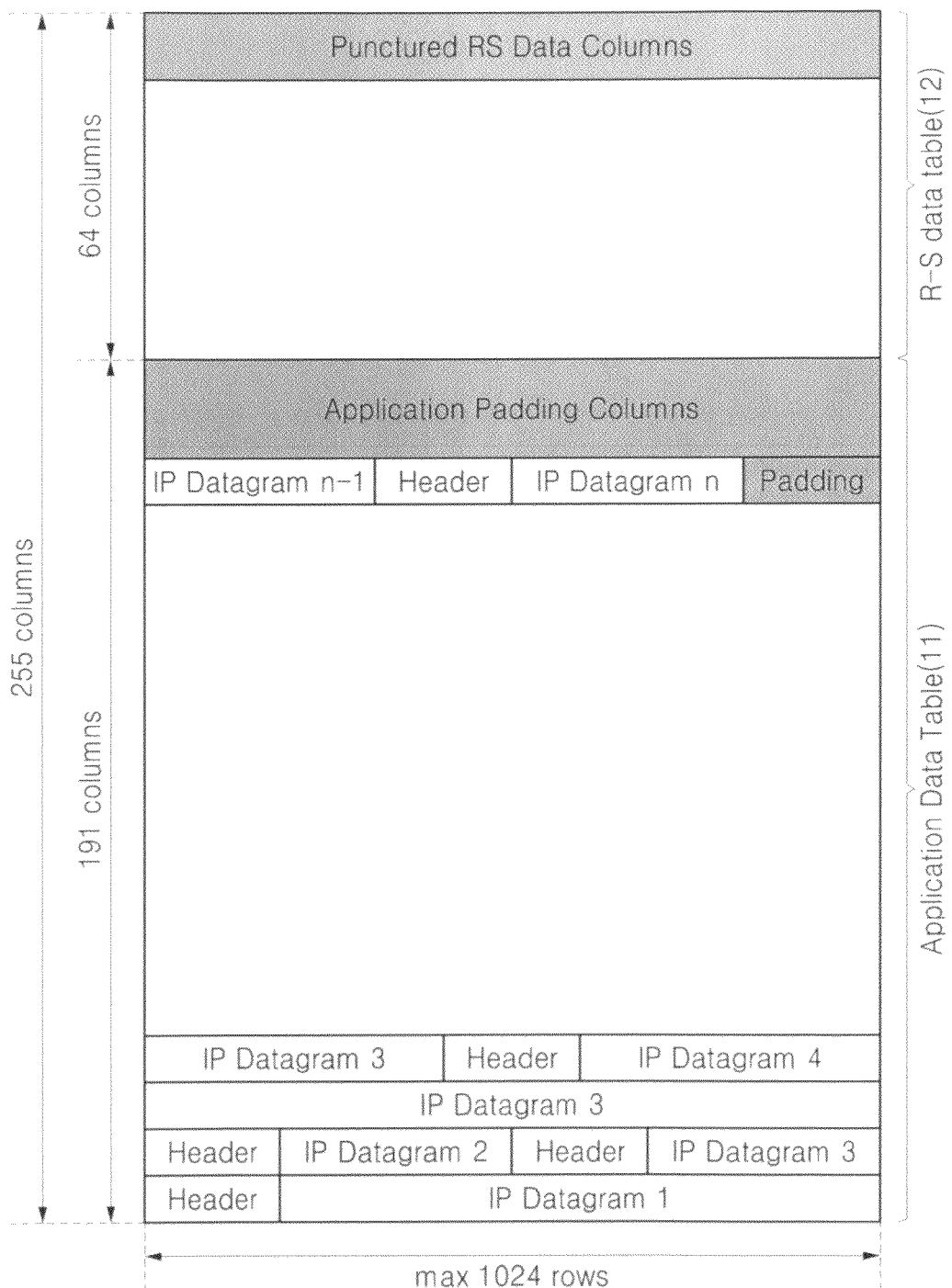
FIG. 2 illustrates a state in which a multi protocol encapsulation (MPE) section and an MPE-forward error correction (FEC) section, which are received to decode broadcast data, are stored in a frame memory in a typical digital broadcast receiving system.

FIG. 2 illustrates a state in which a MPE section and an MPE-FEC section, which are received to decode broadcast data, are stored in a frame memory. A frame memory (e.g., see 43 in FIG. 4) is for storing an MPE-FEC frame, which includes an MPE section and an MPE-FEC section and which is transmitted from a physical layer (e.g., see 15 in FIG. 4). The frame memory 43 stores MPE sections in the application data table 11 and stores MPE-FEC sections in the R-S data table 12. A left part of an MPE-FEC frame includes a part of the application data table 11 and a right part of the MPE-FEC frame includes a part of the R-S data table 12. The MPE-FEC frame may include 255 columns and a maximum of 1024 rows of data (e.g., 255 by a maximum of 1024 bytes).

The application data table 11 stores broadcast data, (e.g., an IP datagram included in an MPE section) of an "a" byte or column width, where "a" is a natural number (e.g., 191). The R-S data table 12 stores R-S data or parity data resulting from R-S encoding of the broadcast data stored in the application data table 11. The data of the R-S data table is "b" bytes or columns in width, where "b" is a natural number (e.g., 64). The number of rows varies with a burst size and may be a maximum of 1024.

A plurality of IP datagrams 1 through "n" are stored in the application data table 11 in a vertical direction. After the application data table 11 is filled with the IP datagrams 1 through "n", the remaining space is subjected to zero-padding and thus filled with "0". Parity data generated from each IP datagram stored in the application data table 11 is stored in the R-S data table 12 in the vertical direction. In this way, an IP datagram and its parity data are respectively stored in the application data table 11 and the R-S data table 12 in the vertical direction. The data stored in the application data table 11 and the R-S data table 12 is read by rows in a horizontal direction. When parity data that has been read is transmitted at a rate of a maximum of 64 bytes, error correction may be performed for up to 64 bytes per FEC codeword. Parity data is stored at a certain part in the R-S data table 12 based on a predetermined punctured value and the remaining space of the R-S data table 12 is subjected to zero-padding and thus filled with "0".

The generated MPE-FEC frame is stored in the frame memory 43. In this way, the application data table 11 is filled with the IP datagrams 1 through "n" sequentially in the vertical direction and the R-S data table 12 is filled with parity data sequentially in the vertical direction. Data stored in each row of the frame memory 43 forms a single FEC codeword, which is the basic unit of data read during MPE-FEC decoding.

Figure 3:
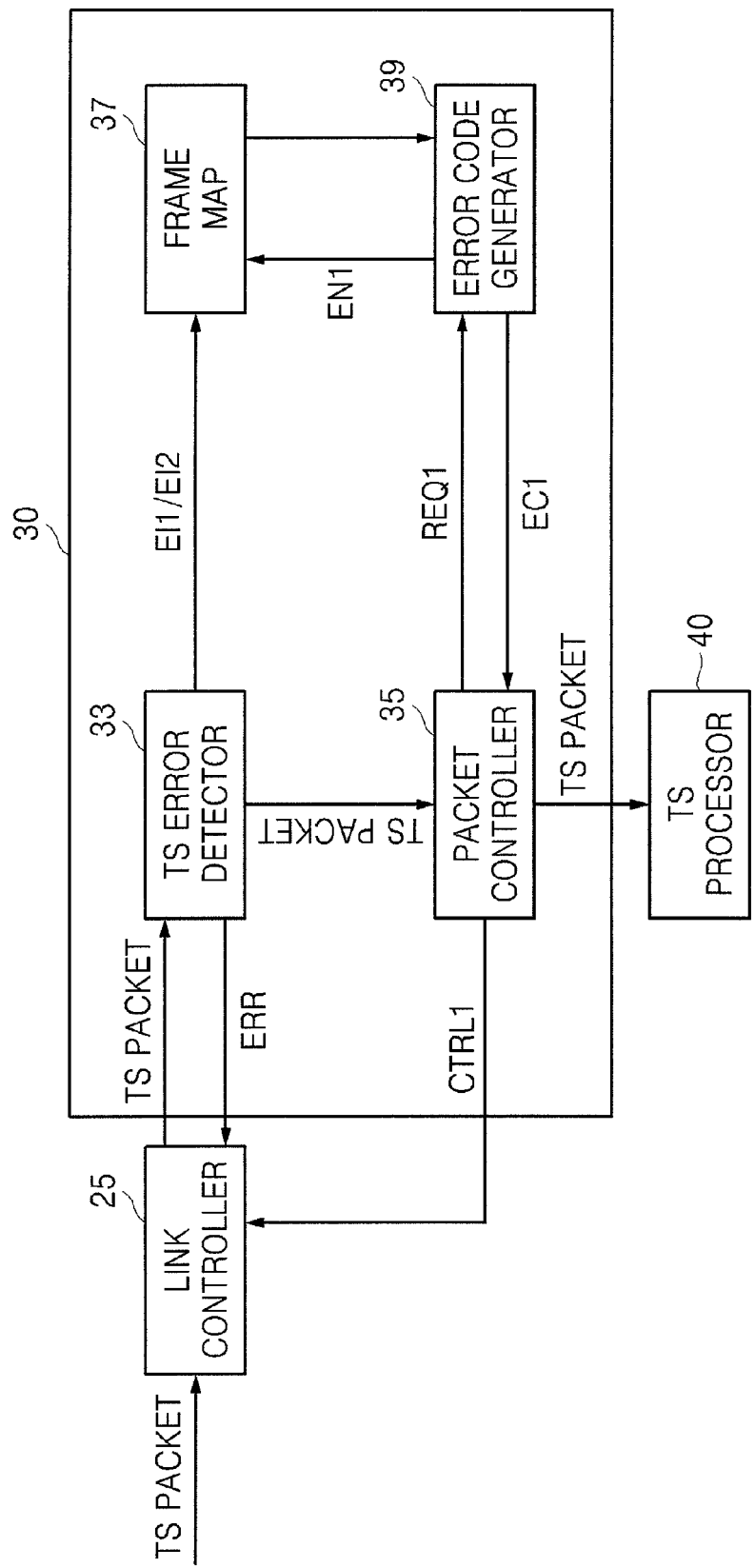
FIG. 3 is a schematic block diagram of a link layer including a frame boundary detector according to an exemplary embodiment of the present invention.
Figure 4:
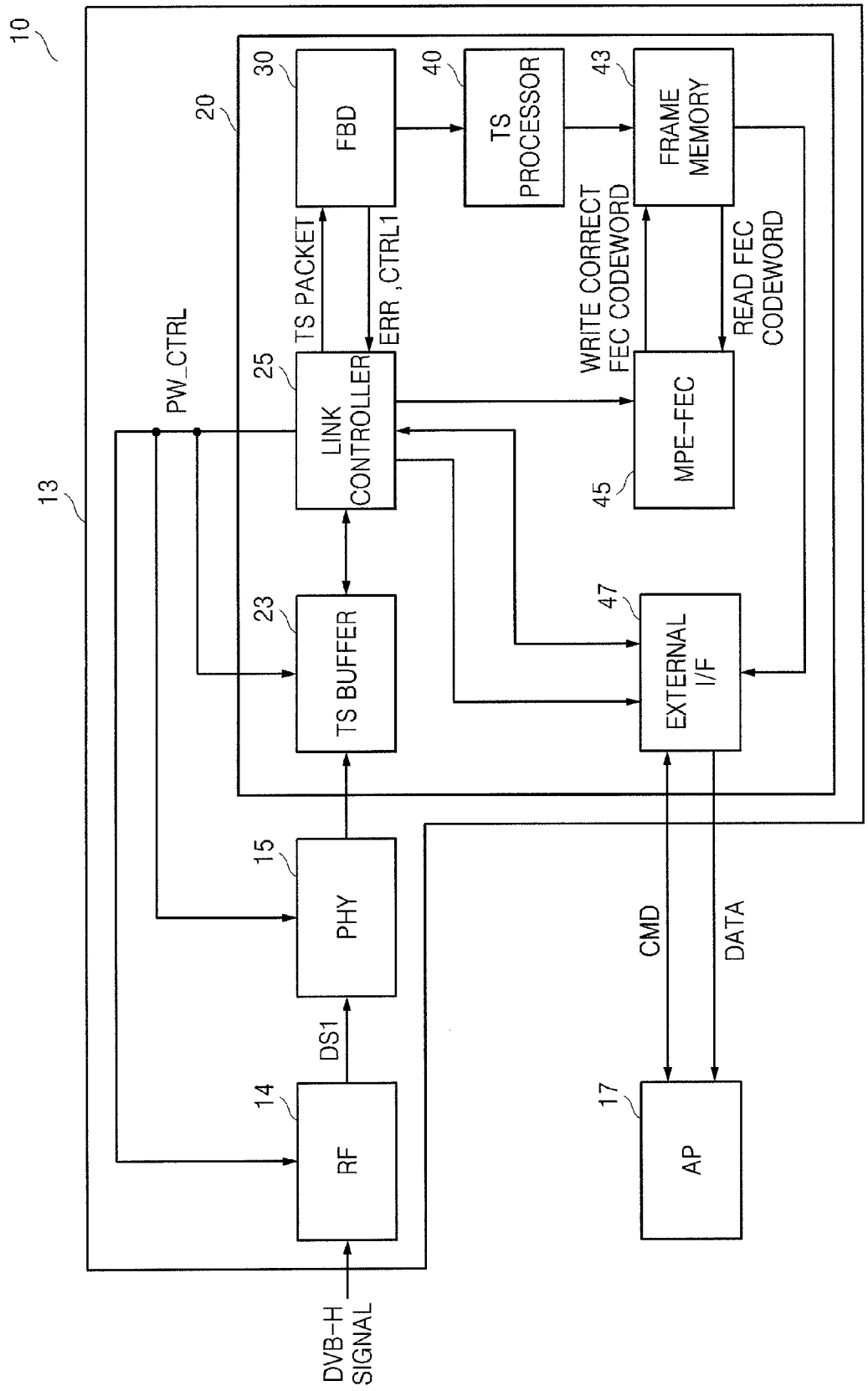
FIG. 4 is a block diagram of a digital broadcast receiving system including a receiver including the link layer illustrated in FIG. 3.

FIG. 3 is a schematic block diagram of a link layer 20 including a frame boundary detector 30 according to an exemplary embodiment of the present invention. FIG. 4 is a block diagram of a digital broadcast receiving system 10 including a receiver 13 including the link layer 20 illustrated in FIG. 3.

Referring to FIGS. 3 and 4, the receiver 13 uses time slicing to receive data transmissions. In time slicing, the amount of time during which data of all services is received is divided into a plurality of time units and a certain amount of data of each service is allocated to each of the time units. The receiver 13 attempts to operate only while the data of a wanted service is being received and switches to a power-save mode during an intermediate time while other services are being transmitted. The receiver 13 is configured to turn on or off the power of a radio frequency (RF) circuit 14, the physical layer 15, and a link layer 20 with a timing for data reception that can reduce overall power consumption.

Referring to FIG. 3, the link layer 20 includes a link controller 25, the frame boundary detector 30, and a TS processor 40. The frame boundary detector 30 includes an error detector 33, a frame map 37, an error code generator 39, and a packet controller 35.

Based on header information included in a TS packet, the error detector 33 determines whether a TS packet has an error based on, for example, a transport error indicator, and determines whether the TS packet is an MPE section or an MPE-FEC section. According to a result of the determination, the error detector 33 generates error information of the TS packet. For example, the error detector 33 analyzes the TS packet and generates first error information EI1 of the MPE section and second error information EI2 of the MPE-FEC section. The first error information EI1 includes error information of data included in the MPE section and the second error information EI2 includes error information of data included in the MPE-FEC section.

As a result of the analysis, when it is determined that the data included in the MPE or MPE-FEC section does not have any error, the error detector 33 generates error information at a first level (e.g., a low level). Alternately, when it is determined that the data included in the MPE or MPE-FEC section has an error, the error detector 33 generates the error information at a second level (e.g., a high level). For example, when the transport error value of the TS packet has been set to "0", the error detector 33 determines that the TS packet does not have any error and generates the first error information EI1 including error information having the first level (e.g., the low level) and the second error information EI2 including error information having the first level (e.g., the low level). When the transport error value of the TS packet has been set to "1", the error detector 33 determines that the TS packet has an error and generates the first error information EI1 and the second error information EI2 according to the analysis result. At least one of the first error information EI1 and the second error information EI2 may include error information having the second level (e.g., the high level). The frame map 37 stores the first error information EI1 of the MPE section and the second error information EI2 of the MPE-FEC section, which have been transmitted from the error detector 33.

The packet controller 35 receives the TS packet output from the error detector 33, analyzes the TS packet, and generates a code request signal REQ1 according to the analysis result. The packet controller 35 determines whether all of the MPE sections have been received based on the header information of the TS packet. For example, the controller 35 determines whether the TS packet includes at least one of a table boundary value and a frame boundary value, and outputs the code request signal REQ1 to the error code generator 39 according to the determination result. In this way, the packet controller 35 may determine whether data in a payload corresponds to an MPE section or an MPE-FEC section based on header information included in the MPE or MPE-FEC section.

For example, when the table boundary value of the TS packet has been set to "1", the packet controller 35 determines that the TS packet is the last MPE section and generates the code request signal REQ1 according to the determination result. When the TS packet does not include a table boundary value (e.g., when the reception or non-reception of the last MPE section cannot be determined), the packet controller 35 determines that all of the MPE sections have been received when at least one MPE-FEC section is received and generates the code request signal REQ1 according to the determination result.

The error code generator 39 is enabled in response to the code request signal REQ1 and receives the first error information EI1 and the second error information EI2 from the frame map 37. The error code generator 39 calculates a maximum number of errors included in each FEC codeword in an MPE-FEC frame based on the first error information EI1 and the second error information EI2 and generates an error generation code EC1 according to the calculation result. For example, the error code generator 39 may change an initial value of "0000" set as the error generation code EC1 into "0001", "0010", . . . , or "1111" according to the number of errors included in each FEC codeword.

The packet controller 35 receives as many MPE-FEC sections as the number of errors corresponding to the error generation code EC1 from the error detector 33 and generates a control signal CTRL1 for reducing power consumption of the receiver 13 after receiving as many MPE-FEC sections as the number corresponding to the error generation code EC1. Consequently, the packet controller 35 may determine a frame end point based on the error generation code EC1.

The link controller 25 disables at least one among the error detector 33, the packet controller 35, the frame map 37, and the error code generator 39 in response to the control signal CTRL1. For example, the error detector 33 may be disabled in response to the control signal CTRL1 output from the link controller 25.

Referring to FIG. 4, the digital broadcast receiving system 10 includes the receiver 13 and a host 17 including an application processor (AP). The receiver 13 includes the RF circuit 14, the physical layer (PHY) 15 converting a digital signal DS1 received from the RF circuit 14 into TS packets, and the link layer 20 transmitting the TS packets to an upper layer. The RF circuit 14 and the host 17 may be implemented on separate chips, respectively. The RF circuit 14 receives an RF signal (e.g., a DVB-H signal including broadcast data received through an antenna from a transmitter (not shown)) and converts the RF signal into the digital signal DS1 by filtering the RF signal.

The PHY 15 generates a TS packet including a header and payload data based on the digital signal DS1 and outputs the TS packet to the link layer 20. The link layer 20 is a protocol layer, which controls the flow of data (e.g., TS packets transmitted from the PHY 15 or other upper layers). The link layer 20 may receive TS packets from the PHY 15 and perform error correction on the TS packets to verify data in an MPE frame.

The link layer 20 includes a link controller 25 that may be used to control the overall system operation of the receiver 13 and the frame boundary detector (FBD) 30. The link layer 20 may also include at least one among a TS buffer 23, a TS processor 40, a frame memory 43, an MPE-FEC block 45, and an external interface (I/F) 47.

The TS buffer 23 can temporarily store one or more TS packets transmitted from the PHY 15. The link controller 25 receives TS packets from the PHY 15 or the TS buffer 23 and controls the TS processor 40 to form an MPE-FEC frame based on TS packets output from the FBD 30. The link controller 25 may also control the operation of at least one among the RF circuit 14, the PHY 15, the TS buffer 23, the FBD 30, and the external I/F 47.

The FBD 30 determines whether TS packets have errors based on header information of the TS packets and generates the first error information EI1 regarding MPE sections and the second error information EI2 regarding MPE-FEC sections according to the determination result. The FBD 30 also estimates the number of MPE-FEC sections necessary for error correction of an FEC-codeword in an MPE-FEC frame based on the first error information EI1 and the second error information EI2. In addition, the FBD 30 analyzes the TS packets, detects a frame boundary based on the analysis result, and generates the control signal CTRL1.

The TS processor 40 receives the TS packets from the FBD 30, analyzes the TS packets, forms an MPE-FEC frame based on the analysis result, and stores the MPE-FEC frame in the frame memory 43. For example, the TS processor 40 stores payloads, e.g., MPE sections and MPE-FEC sections of the TS packets received from the FBD 30 separately in the application data table 11 and the R-S data table 12 in the frame memory 43.

The frame memory 43 is controlled by the TS processor 40 to store the TS packets, e.g., IP packets including MPE sections or MPE sections and at least one MPE-FEC section, which are output from the FBD 30. The MPE-FEC block 45 may perform error correction on the IP packets stored in the frame memory 43 according to an R-S algorithm and stores error-corrected IP packets in the frame memory 43.

The external I/F 47 is controlled by the link controller 25 to perform data communication with the host 17. The host 17 may be a main processor, a personal terminal such as a cellular phone, a PMP, or a PDA, a digital camera, or a navigator device.

The link controller 25 generates a power mode control signal PW_CTRL in response to the control signal CTRL1 and enables or disables the error detector 33 and the MPE-FEC block 45. At least one of the RF circuit 14, the PHY 15, and the TS buffer 23 enters a power-off mode in response to the power mode control signal PW_CTRL output from the link controller 25.

For example, when a TS packet does not have an error, the link controller 25 disables the error detector 33 and the MPE-FEC block 45 in response to the control signal CTRL1, and the RF circuit 14, the PHY 15, and the TS buffer 23 enter the power-off mode in response to the power mode control signal PW_CTRL output from the link controller 25. The link controller 25 may simultaneously control the external I/F 47 to transmit an IP packet stored in the frame memory 43 to the host 17. After the transmission of the IP packet is completed, the link controller 25 disables the frame memory 43 and the external I/F 47 and enters a stand-by mode until a subsequent burst is received.

When a TS packet has an error ERR, the link controller 25 disables the error detector 33 and enables the MPE-FEC block 45 in response to the control signal CTRL1. The RF circuit 14, the PHY 15, and the TS buffer 23 enter the power-off mode in response to the power mode control signal PW_CTRL. The MPE-FEC block 45 receives an FEC codeword in a MPE-FEC frame from the frame memory 43, performs error correction of the FEC codeword, and stores a corrected FEC codeword in the frame memory 43. The link controller 25 controls the external I/F 47 to transmit an IP packet stored in the frame memory 43 to the host 17. After the completion of the error correction, the link controller 25 interrupts power to the frame memory 43 and enters the stand-by mode until a subsequent burst is received. In addition, after the transmission of the IP packet is completed, the link controller 25 disables the frame memory 43, the MPE-FEC block 45, and the external I/F 47 and enters the stand-by mode_until a subsequent burst is received.

As described above, the digital broadcast receiving system 10 can reduce power consumption by flexibly controlling an operating time, e.g., a turn-off time of the receiver 13 according to the quality of a received signal (e.g., a TS packet). When an error occurs at the last MPE section even in a normal channel environment, a receiver in a conventional digital broadcast receiving system must remain in a power-on state until a predetermined time corresponding to a maximum burst lapses. However, the digital broadcast receiving system 10 according to at least one exemplary embodiment of the present invention does not depend on the last MPE section, thereby reliably controlling the power of the receiver 13 according to a receiving environment.

In at least one embodiment of the present invention, a TS packet encoded by a transmitter (not shown) using R-S coding is received and error correction is performed on the TS packet according to an R-S algorithm. However, error correction in embodiments of the present invention is not restricted to the R-S algorithm. For example, when the transmitter encodes a TS packet using convolutional coding, the receiver 13 may perform error correction of the TS packet according to a soft-decision Viterbi decoding algorithm.

Figure 5:
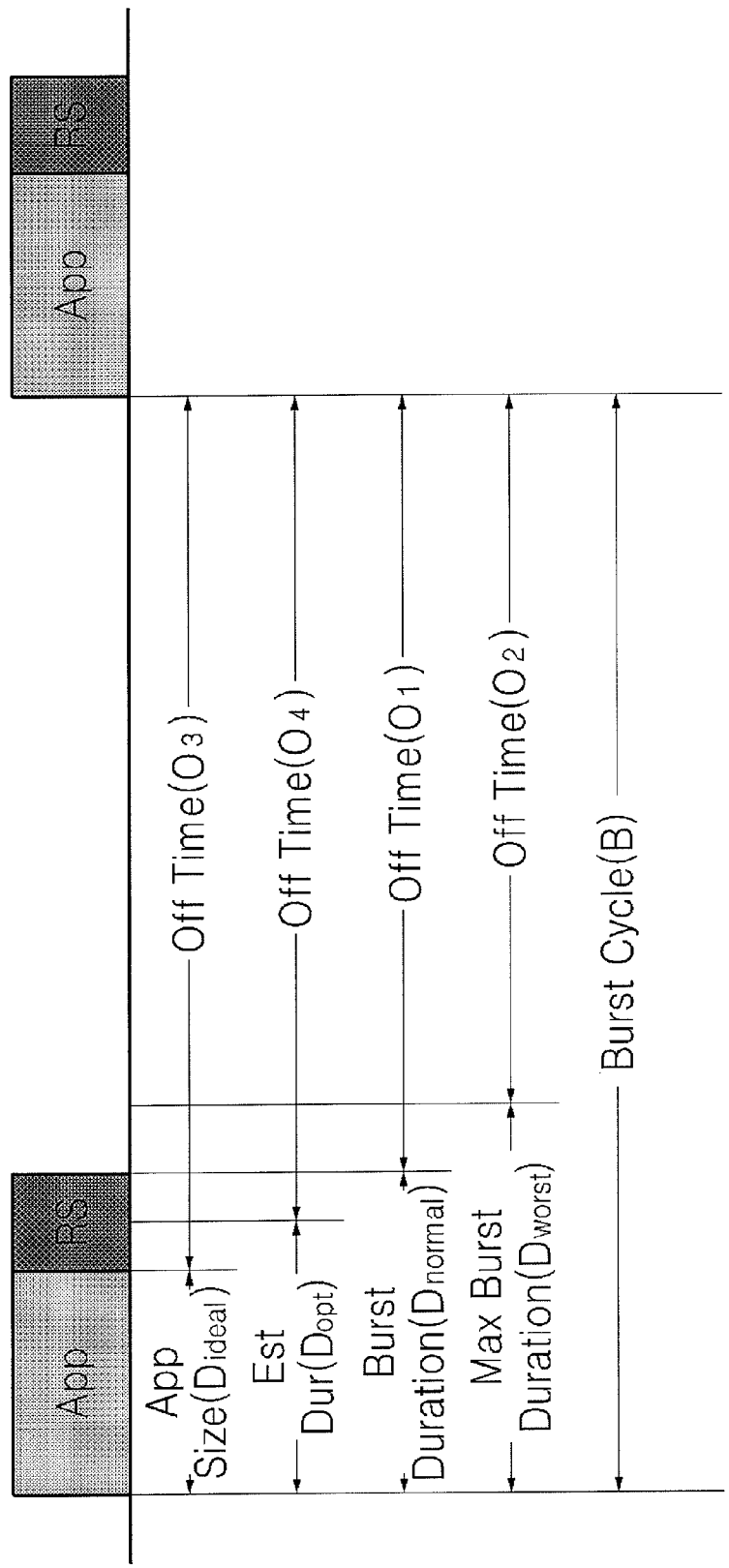
FIG. 5 is a diagram for explaining that turn-off time is determined according to detection or non-detection of a frame boundary in a receiver according to an exemplary embodiment of the present invention.

FIG. 5 is a diagram for explaining that turn-off time may be determined according to a detection or non-detection of a frame boundary in the receiver 13 according to an exemplary embodiment of the present invention. A transmitter (not shown) can use time slicing to transmit data at a high data rate during only a burst duration Dnormal instead of transmitting data uniformly throughout a burst cycle B. Accordingly, the burst cycle includes a burst duration in which data is transmitted and an off duration in which the data is not transmitted. A single MPE-FEC frame may be transmitted in a single burst duration.

A conventional receiver receives TS packets (e.g., MPE sections and MPE-FEC sections) during the burst duration Dnormal and then the receiver is turned off until a subsequent burst is received (e.g., for a first off time O1). When an error occurs in the last MPE-FEC section, even if the TS packets (e.g., the MPE sections and the MPE-FEC section) are normally received, the conventional receiver cannot detect the frame end point in the TS packets. Accordingly, the conventional receiver is not turned off at the precise moment when all of the MPE sections and the MPE-FEC sections have been received, but maintains a turn-on state until a maximum burst duration Dworst lapses and is then turned off until a subsequent burst is received (e.g., for a second off time O2). The maximum burst duration Dworst defined in Program Specific Information/Service Information (PSI/SI) indicates a duration allocated when data included in an overall MPE-FEC frame is transmitted. Different from the conventional receiver, a received according to at least one exemplary embodiment of the present invention is turned off when the amount of data in actually transmitted TS packets is less than the capacity of the MPE-FEC frame.

According to at least one embodiment of the present invention, the receiver 13 can detect a frame boundary based on a received TS packet regardless of the presence or absence of an error in the TS packet. When TS packets do not have any error, the receiver 13 maintains the turn-on state just for a first duration Dideal while MPE sections are received and then switches to a turn-off state until a subsequent burst is received (e.g., for a third off time O3). When the TS packets have an error, the receiver 13 maintains the turn-on state just for a second duration Dopt while the MPE sections and at least one MPE-FEC section necessary for error correction are received and then switches to the turn-off state until a subsequent burst is received (e.g., for a fourth off time O4). In this way, the receiver 13 according to at least one embodiment of the present invention adaptively estimates a frame end point based on received TS packets and enters a power-off state with more exact timing, thereby minimizing power consumption.

FIG. 6 is a flowchart of a method of processing a data error in the digital broadcast receiving system 10 according to an exemplary embodiment of the present invention. Referring to FIGS. 3 through 6, the receiver 13 is turned on based on header information of previously received TS packets, e.g., delta-T information indicating a time when a subsequent burst duration starts, in operation S100.

The link controller 25 receives TS packets including header information and payload data and controls the TS processor 40 to separately store TS packets output from the FBD 30 in the application data table 11 and the R-S data table 12 of the frame memory 43 in operation S102. The error detector 33 determines whether each of the TS packets has any error based on the header information (e.g., a transport error indicator) of each TS packet and stores first error information EI1 and second error information EI2 generated as the determination result in the frame map 37. The error code generator 39 counts a maximum number of errors included in a single FEC codeword of an MPE-FEC frame based on the first error information EI1 and the second error information EI2 stored in the frame map 37 and generates an error generation code EC1 according to the detection result in operation S106.

The packet controller 35 sequentially receives the TS packets output from the error detector 33, analyzes each TS packet, and determines a time point when all MPE sections are received according to the analysis result in operation S108. When a TS packet having a table boundary value of "1" is received, the packet controller 35 recognizes the TS packet as the last MPE section and determines that all MPE sections have been received. When the table boundary value of all TS packets is not "1", the packet controller 35 analyzes the header information of each TS packet and determines that all MPE sections have been received only when at least one MPE-FEC section is received according to the analysis result S114.

When it is determined that all MPE sections have been received, the packet controller 35 receives the error generation code EC1 output from the error code generator 39 and detects the maximum number of errors in the FEC codeword based on the error generation code EC1 in operation S110. For example, when the error generation code EC1 is "0000", the packet controller 35 determines that the FEC codeword does not have any error (e.g., see flow (a)). At this time, the TS processor 40 generates an MPE-FEC frame based on the TS packets output from the FBD 30, stores the MPE-FEC frame in the frame memory 43, controls the frame memory 43 to output an IP packet without error correction, and then enters a power-off mode. When the error generation code EC1 is not "0000", the packet controller 35 determines that the FEC codeword has an error. When the error generation code EC1 is "0001", the packet controller 35 may determine that the FEC codeword has a single error. When the error generation code EC1 is "0010", the packet controller 35 may determine that the FEC codeword has two errors. At this time, the packet controller 35 receives as many MPE-FEC sections as the number of errors corresponding to the error generation code EC1 in operation S112.

The packet controller 35 receives as many MPE-FEC sections as the number of errors corresponding to the error generation code EC1 (see e.g., flow (b)) and the TS processor 40 stores the MPE sections and the MPE-FEC sections, which are output from the packet controller 35, in the frame memory 43. The MPE-FEC block 45 performs error correction on each FEC codeword of the MPE-FEC frame stored in the frame memory 43 in operation S118 (e.g., according to an R-S algorithm). After outputting the IP packet stored in the frame memory 43, the receiver 13 enters into the power-off mode in operation S120.

A conventional digital broadcast receiving system receives all TS packets (e.g., all MPE sections and MPE-FEC sections) of an MPE-FEC frame, generates an IP packet (see e.g., flow (c)), and then performs error correction by executing the R-S algorithm on the IP packet in operation S118. In addition, when an error occurs in the last MPE-FEC section, the conventional digital broadcast receiving system performs the error correction in operation S118 after a maximum burst duration lapses.

In contrast to the conventional system, the digital broadcast receiving system 10 according to at least one exemplary embodiment of the present invention estimates the end point of a frame based on received TS packets regardless of the presence or absence of errors, thereby turning off the receiver 13 with more exact timing. Accordingly, the digital broadcast receiving system 10 can minimize unnecessary power consumption.

As described above, a digital broadcast receiving system according to the present invention estimates an end point of a frame based on received data and turns off a receiver with timing to reduce power consumption.

While the present invention has been particularly shown and described with reference to exemplary embodiments thereof, it will be understood by those of ordinary skill in the art that various changes in forms and details may be made therein without departing from the spirit and scope of the disclosure.

What is claimed is:

1. A receiver comprising:
a frame boundary detector configured to receive a plurality of transport stream (TS) packets, determine a maximum count of errors from the TS packets and generate a control signal based on boundary information in the TS packets when a number of multi protocol encapsulation-forward error correction (MPE-FEC) sections have been received that is less than the count; and
a link controller configured to deactivate a part of the receiver to disable forwarding of subsequent TS packets in response to the control signal,
wherein each of the TS packets is a multi protocol encapsulation (MPE) section or a multi protocol encapsulation-forward error correction (MPE-FEC) section,
wherein the frame boundary detector comprises an error detector configured to determine whether the TS packets including the MPE section and the TS packets including the MPE-FEC have errors based on header information of the corresponding TS packets to generate first error information indicating errors within the MPE sections and second error information indicating errors within the MPE-FEC sections, and
wherein the frame boundary detector generates the control signal in response to an error generation code, the code generated when the boundary information includes a table boundary value or when at least one MPE-FEC section is received and the boundary information excludes the value.

2. The receiver of claim 1, wherein the frame boundary detector further comprises:
an error code generator configured to generate the error generation code based on the first error information and the second error information; and
a packet controller configured to analyze each of the TS packets output from the error detector, receive the error generation code according to a result of the analysis, receive as many MPE-FEC sections as the number of errors corresponding to the error generation code, and then generate the control signal.

3. The receiver of claim 2, wherein the frame boundary detector further comprises:
a frame map configured to receive and store the first error information and the second error information generated by the error detector.

4. The receiver of claim 3, wherein the link controller enables or disables at least one among the error detector, the packet controller, the frame map, and the error code generator in response to the control signal.

5. The receiver of claim 1, wherein the receiver uses time slicing.

6. The receiver of claim 1, wherein the header information used to determine the error is a one bit transport error indicator.

7. A digital broadcast receiving system comprising:
a radio frequency (RF) circuit configured to convert an RF signal into a digital signal;
a physical layer configured to convert the digital signal into a plurality of transport stream (TS) packets;
a frame boundary detector configured to receive the TS packets, determine a maximum count of errors from the TS packets and generate a control signal based on boundary information in the TS packets when a number of multi protocol encapsulation-forward error correction (MPE-FEC) sections have been received that is less than the count; and
a link controller configured to generate a power control signal for controlling power of the frame boundary detector in response to the control signal,
wherein each of the TS packets is a multi protocol encapsulation (MPE) section or a multi protocol encapsulation-forward error correction (MPE-FEC) section,
wherein the frame boundary detector generates the control signal in response to an error generation code, the code generated when the boundary information includes a table boundary value or when at least one MPE-FEC section is received and the boundary information excludes the value.

8. The digital broadcast receiving system of claim 7, wherein the frame boundary detector comprises:
an error detector configured to determine whether each of the TS packets has an error based on header information of each TS packet and generate first error information regarding MPE sections and second error information regarding MPE-FEC sections; and
a packet controller configured to analyze each of the TS packets output from the error detector and generate the control signal based on a result of the analysis.

9. The digital broadcast receiving system of claim 8, wherein the frame boundary detector further comprises:
a frame map configured to receive and store the first error information and the second error information generated by the error detector; and
an error code generator configured to generate the error generation code based on the first error information and the second error information, and
the packet controller receives the error generation code according to a result of the analysis, receives as many MPE-FEC sections as the number of errors corresponding to the error generation code, and then generates the control signal.

10. The digital broadcast receiving system of claim 7, wherein power control signal enables or disables the frame boundary detector.

11. A receiver comprising:
an error detector receiving a plurality of transport stream (TS) packets including at least one multi protocol encapsulation MPE section and at least one multi protocol encapsulation-forward error correction MPE-FEC section, wherein the error detector is configured to examine a header of each section to determine a count of the number of errors within the sections;
a packet controller configured to receive the TS packets from the error detector, determine a boundary time point between a last one of the least one MPE section and a first one of the least one MPE-FEC section, request the count from the error detector at the boundary point time, and output a control signal when a number of the MPE-FEC sections less than the count are received; and
a link controller configured to deactivate a part of the receiver in response to the control signal to disable forwarding of subsequent TS packets,
wherein the boundary time point occurs when a boundary table value is present in one of the TS packets or when no boundary table value is present and at least one MPE-FEC section is received.

12. The receiver of claim 11, wherein the error detector further comprises:
a frame map to store error information associated with the header of each of the sections;
an error code generator configured to access the error information of the frame map to generate the count, the error code generator enabled in response to the request from the packet controller.

13. The receiver of claim 12, wherein the link controller is configured to disable at least one of the error detector, the packet controller, the frame map, and the error code generator in response to the control signal.

14. The receiver of claim 11, wherein the header includes a one bit transport error indicator to determine the count.

15. A receiver comprising:
a frame boundary detector configured to receive a plurality of transport stream (TS) packets, determine a maximum count of errors from the TS packets, and generate a control signal based on boundary information in the TS packets when a number of multi protocol encapsulation-forward error correction (MPE-FEC) sections have been received that is less than the count; and
a link controller configured to deactivate a part of the receiver to disable forwarding of subsequent TS packets in response to the control signal,
wherein each of the TS packets is a multi protocol encapsulation (MPE) section or a multi protocol encapsulation-forward error correction (MPE-FEC) section,
wherein the frame boundary detector comprises:
an error detector configured to determine whether each of the TS packets has an error based on header information of each TS packet and generate first error information regarding MPE sections and second error information regarding MPE-FEC sections;
an error code generator configured to generate an error generation code based on the first error information and the second error information; and
a packet controller configured to analyze each of the TS packets output from the error detector, receive the error generation code according to a result of the analysis, receive as many MPE-FEC sections as the number of errors corresponding to the error generation code, and then generate the control signal,
wherein the packet controller receives the error generation code based on a table boundary value when the analysis result shows that at least one of the TS packets includes the table boundary value, and the packet controller receives the error generation code when at least one MPE-FEC section is received when the analysis result shows that each of the TS packets does not include the table boundary value.

* * * * *